(12) United States Patent
Cai et al.

(10) Patent No.: US 6,873,017 B2
(45) Date of Patent: Mar. 29, 2005

(54) ESD PROTECTION FOR SEMICONDUCTOR PRODUCTS

(75) Inventors: Jun Cai, Scarborough, ME (US); Alvin Sugerman, Scarborough, ME (US); Steven Park, Falmouth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/438,349

(22) Filed: May 14, 2003

(65) Prior Publication Data

US 2004/0227190 A1 Nov. 18, 2004

(51) Int. Cl.⁷ .............................................. H01L 23/62
(52) U.S. Cl. ....................................................... 257/355
(58) Field of Search ................................. 257/355, 356, 257/357, 358, 359, 360, 361, 362, 363, 364, 365, 336, 339, 342

(56) References Cited

U.S. PATENT DOCUMENTS

| 5,559,352 | A |   | 9/1996 | Hsue et al. |
| 5,777,368 | A | * | 7/1998 | Wu et al. ............... 257/360 |
| 6,071,775 | A | * | 6/2000 | Choi et al. ............. 438/257 |
| 6,420,770 | B1 | * | 7/2002 | Xiang et al. ........... 257/506 |
| 6,444,511 | B1 |   | 9/2002 | Wu et al. |

OTHER PUBLICATIONS

U.S. Appl. No. 09/781,430, filed Aug. 2002, Hsu et al.*

* cited by examiner

*Primary Examiner*—Long Pham
*Assistant Examiner*—Dana Farahani
(74) *Attorney, Agent, or Firm*—Thomas R. FitzGerald, Esq.

(57) ABSTRACT

Device 60 in FIG. 3 has junctions 86 each with a lateral portion 90 and a second portion 92 extending upward toward the surface 12 from the lateral portion 90. The lateral portions 90, as illustrated in FIG. 3, are more or less formed along a plane parallel with the surface 12. The upwardly extending portions 92 include characteristic curved edges of the diffusion fronts which are associated with the planar process. With the regions 80 and 82 each having relatively high net dopant concentrations of different conductivity types, each lateral junction portion 90 includes a relatively large sub region 96 which extends more deeply into the layer 10. When compared to other portions of the junctions 86, the subregions 96 are characterized by a relatively low breakdown voltage so that ESD current is initially directed vertically rather than laterally.

20 Claims, 4 Drawing Sheets

ESD PROTECTION FOR SEMICONDUCTOR PRODUCTS

FIELD OF THE INVENTION

This invention relates to semiconductor devices and, more particularly, to the provision of electrostatic discharge (ESD) protection of integrated circuitry.

BACKGROUND

The Field Effect Transistor (FET) has become the most common device used in integrated circuitry, providing a wide variety of electronic tasks, e.g., analog signal processing, memory functions, high speed, low power logic operations and power switching.

During the last decade the semiconductor industry has more fully embraced the use of protection circuitry to shield FET's and other circuitry from damage associated with brief, high power voltage spikes such as the ESD. Because the FET is in many instances the prevalent device type on such circuitry it is often most convenient to form transistor protection devices coincident with the fabrication of FETs. This allows economy, i.e., avoidance of extra fabrication steps.

Although formation of the protection device follows the process fabrication sequence of functional circuit FETs, the transistor operation which provides the over voltage protection is often based on bipolar action. That is, inherent in most FET structures there is a bipolar structure, sometimes termed a parasitic, which can be placed into conduction when certain minimum voltages are applied across input terminals of the integrated circuit.

In the past, parasitic devices associated with functional circuitry have sometimes provided unintended conduction paths that carry the ESD surge and create thermal damage along that path. As a solution, transistor devices are configured to form circuit paths which shunt the majority of damaging power to a ground terminal while avoiding more sensitive conduction paths through which transient, yet high current, high voltage conditions would cause damage.

Generally, efforts to economically incorporate ESD protection devices on an integrated circuit require compromises either in performance or manufacturing costs. As trends continue for increased circuit density and lower operating voltages it is becoming more of a challenge to avoid compromises between performance of functional circuitry and ESD circuitry. More specifically, these trends make it increasingly difficult to effectively shunt heat away from thermally sensitive regions. With decreased operating voltages, the provision of optimal protection should require that the ESD circuitry be tuned to more quickly respond to ESD events. While it is desirable to optimize the ESD device turn-on voltage in order to provide maximum protection before damaging the functional circuitry, it is recognized that when the parasitic devices are optimized to provide ESD protection, there can be less satisfactory performance of the functional circuitry.

CMOS integrated circuits with ESD protection transistors are shown in U.S. Pat. Nos. 5,559,352 and 6,444,511. Both patents show examples where the source and drain of the ESD device is provided with a p-implant beneath the source and drain. The p-implant is supposed to lower the breakdown voltage of the ESD device so that it triggers before the CMOS device fails. However, I found that the narrow p-implant tends to shift the ESD current laterally so that the ESD device directs the current beneath the gate and has too high a current density. That defect is caused in part by the making the p-implant late the process where the contact opening is used as a mask for the P-type ions. The relatively narrow contact opening results in a narrow p-implant beneath the source and drain of the ESD device. This causes a high current density proximate the surface of the device, although it would be better in the current peaked deeper in the device.

Another trend which limits the performance of ESD protection circuitry relates to marked decreases in gate breakdown voltages. For device designs in the 0.25 micron regime it is common for gate thicknesses to be less than 60 Angstroms. To avoid damage to the FET gate insulator it is necessary to assure fast and satisfactory bipolar conduction during the transient event. It is also necessary to reduce the trigger-on voltage of the ESD device to values substantially lower than the gate breakdown voltage to conduct current along a path which avoids inflicting damage on the gate structure. Solutions which address this concern should have application in a wide variety of semiconductor products including those manufactured with CMOS, BiCMOS and power processes.

SUMMARY

In accordance with this invention, an ESD device is provided with a P body implant that is wider than the contact via. As such, the invention performs the P body implant earlier in the fabrication process. In the preferred embodiment, the P body implant for the ESD device may be formed at the same time and the P body implant for a DMOS device. The P body implant for the ESD device is formed through an opening a resist mask. The same mask may be used for the P body of a DMOS device. Those skilled in the art understand that the opening for the P body implant can be made to any suitable size to accommodate the desired breakdown voltage of the ESD device. The larger P body implant, compared to the prior art ESD devices, reduces the lateral current and provides a lower current density during breakdown so that the maximum temperature increase due to breakdown occurs in the body of the device and not at a contact where contact metal may spike into the surface. By directing the breakdown current away from the lateral direction, the maximum current density occurs deeper in the body of the device, and not proximate the surface. The invention provides, in effect, a lateral NPN parasitic transistor with a larger emitter area than the emitter areas in conventional parasitic NPN devices. The larger emitter area is disposed beneath the surface of the substrate so that a significant amount of the breakdown current is directed initially vertically away from the surface toward the hetero-doped region.

BRIEF DESCRIPTION OF DRAWINGS

The invention will be more fully understood when the following detailed description is read in conjunction with the drawings wherein.

Figure 1:
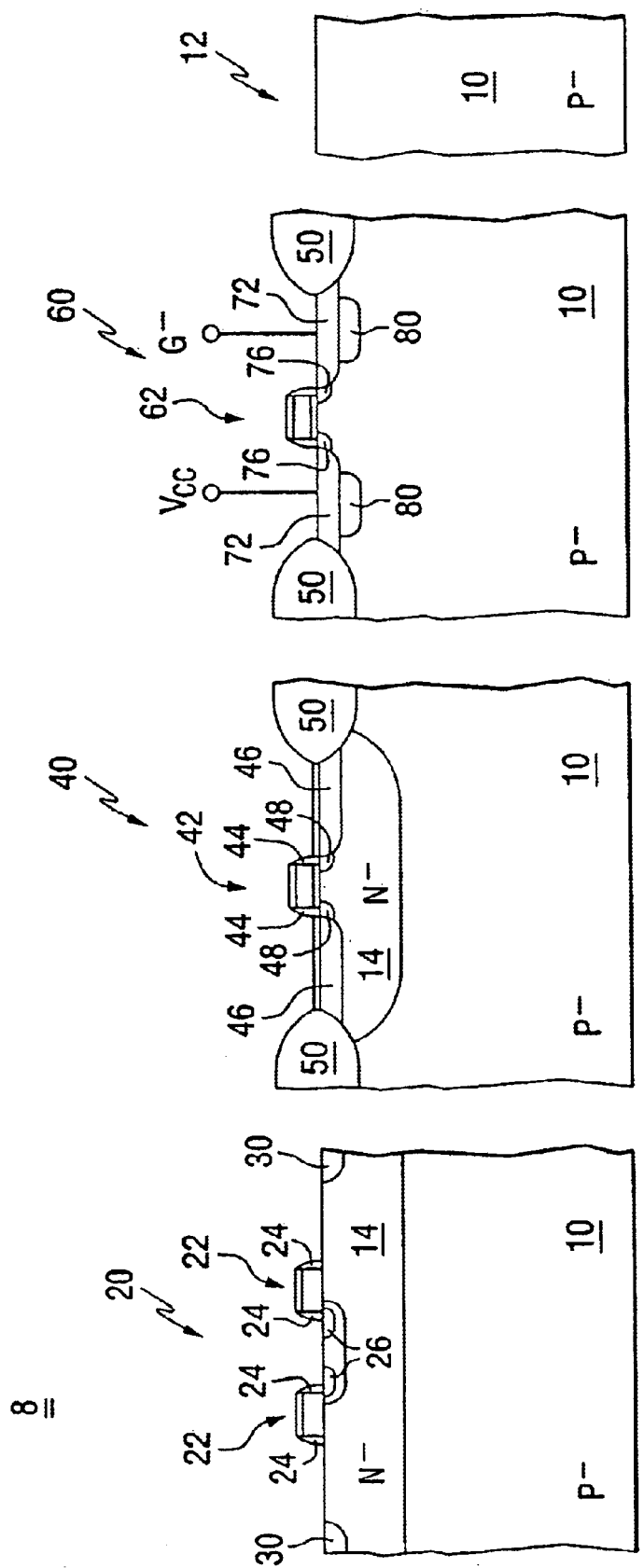
FIG. 1 is a partial view in cross section of a semiconductor product according to the invention.

In accord with common practice the various illustrated features in the drawings are not to scale, but are drawn to emphasize specific features relevant to the invention. Moreover, the sizes of features and the thicknesses of layers may depart substantially from the scale with which these are shown. Reference characters denote like elements throughout the figures and the text.

DETAILED DESCRIPTION OF THE INVENTION

In the following descriptions any dimensions provided are with reference to distances taken along the corresponding view. In a cross sectional view, a width or lateral dimension is intended to mean a distance along a horizontal plane parallel with a plane semiconductor surface, while a height or depth is intended to mean a distance taken along a vertical dimension of the view, more or less orthogonal with the plane semiconductor surface. For purposes of comparing example embodiments of the invention with prior-known designs, it may be assumed that all devices illustrated are fabricated with the same photolithographic capability. The disclosed embodiments assume a minimum feature size, i.e., line width geometry, of 0.35 micron although the invention is applicable to a wide range of line width geometries, device densities and types of semiconductor products.

As used herein the term substrate means a layer over which or in which a structure such as a portion of a transistor device is formed. Reference to dopant implantation in a layer, or the diffusion profile that results from an implant, as being self-aligned with respect to a feature or an associated structure means that the implantation or diffusion is one which results from using that structure as a mask element. Accordingly, implanted dopant, both before and after heat-activated diffusion, will exhibit a characteristic profile in relation to the structure or an associated feature. While many small geometry (i.e., less than 0.5 micron lithography) FET structures are based on self-aligned processes, and preferred embodiments of the invention may incorporate some such self-aligned features, the ESD devices disclosed herein may be optimally formed with at least some features which are not self-aligned with respect to associated FET gate structures.

Although not specifically described herein, it will be understood that implanted dopants illustrated in the figures may have undergone various heat-activated diffusions during the fabrication process in order to acquire predictable post-diffusion profile characteristics. The figures may at times illustrate pre- or post-diffusion characteristics in order to illustrate features of the invention without regard to whether associated diffusion activation energies would necessarily be applied at that stage of fabrication.

It is also to be understood that when a layer is described as positioned on or over another layer, there may be another intervening layer (not illustrated) associated with the same or an alternate embodiment of the invention.

Some solutions have been proposed to provide more optimal ESD protection while not degrading performance of functional circuitry. See, for example, U.S. Pat. No. 5,539,352 which discloses provision of an implant beneath a source/drain region in order to reduce the junction breakdown voltage. Such use of implants to reduce breakdown voltage may allow some current to be discharged through the protection device sooner than would otherwise occur and in this regard can result in faster dissipation of some of the power. Even so, performance of protection circuitry is subject to other manufacturing considerations.

In advanced process design the FET includes lightly doped drain extensions (LDD) between the more heavily doped source/drain diffusions and the FET gate structure. One of the purposes of the LDD is to reduce hot carrier injection in the FETs associated with functional circuitry. On the other hand, performance of the ESD protection device is limited by the presence of a higher resistivity LDD structure and discharge through a LDD contributes to peak heating near the semiconductor surface. With insulator material such as silicon oxide or silicon nitride overlying the semiconductor surface, the region about the LDD and associated gate structure has relatively poor thermal conductivity, rendering the discharge path subject to potentially damaging thermal peaks. Elimination of the LDD structure in the protection device might require a dedicated mask step at additional manufacturing expense.

Although siliciding the source/drain and gate regions reduces sheet resistance, it also reduces the power handling capacity of the protection circuitry because silicide enhances lateral movement of discharge current through the silicon and near the surface. For high ESD device performance, we need to impede lateral movement of discharge current through the silicon near surface. However, due to silicide layer on the silicon surface with very low sheet resistance, most current will go through the silicide layer, therefore, the total current will be near the surface and the device will have poor ESD performance. Therefore, silicide will enhance the undesired lateral ESD discharge current flow and near surface with poor ESD performance. To remedy this problem others have, at additional process expense, masked portions of the ESD device structure, i.e., portions of the source/drain regions (including the LDD structure) and portions of the gate regions in order to block silicide formation thereon. Silicide blocking will impede lateral discharge current flow through the silicon albeit near regions of low thermal conductivity. However, it would be advantageous to avoid a silicide blocking step while further reducing current localization through portions of the silicon near the regions of low thermal conductivity.

Accordingly, it would be desirable to provide, within the semiconductor structure, a high current, low resistance path for conducting the discharge to ground. Preferably, this path should be as far away from thermally sensitive surface regions as practical to avoid heat damage to nearby structures.

It is typical in parasitic lateral bipolar structures that, once the transistor is in a conduction mode, the primary current path occurs through a relatively narrow emitter-base junction, i.e., through the sidewall of a source/drain region. This is even true for structures having implants beneath the source/drain diffusions to reduce the breakdown voltage threshold as disclosed in U.S. Pat. No. 5,539,352.

Although the substrate current must forward bias at least a small region of the source/substrate or drain/substrate junction in order to turn on the parasitic device, it is now recognized that improved performance will be had, under forward bias or reverse bias conditions, by rendering conductive a larger portion of the emitter-base junction. The intrinsic base region is most preferably positioned substantially, and preferably at least 0.3 micron, below the substrate surface.

By way of illustration, FIG. 1 shows a semiconductor product 8 in partial cross section having, for example, three types of devices formed in spaced-apart relation. The devices are formed in different portions of a lightly doped P-type semiconductor layer 10 having a plane upper surface 12 formed along a crystal plane. A plurality of N-wells 14 is formed in the layer 10, each extending from the surface 12 into the layer 10. A Lateral Double Diffused MOS transistor (LDMOS) 20 is formed in one of the N-wells of the layer 10, providing, for example, a power switching function in conjunction with other circuitry (not shown) fabricated on different portions of the product 8. Generally, the LDMOS includes silicided, spaced-apart gate electrodes 22 including sidewall spacers 24, silicided N-type source regions 26 formed in a lightly doped P-body region 28 and silicided N-type drain regions 30. Other details of the LDMOS 20 are described in related application Ser. No. 10/315,517, "Integrated Circuit Structure with Improved LDMOS Design," filed Dec. 10, 2002, now incorporated herein by reference. A conventional lateral FET device 40, of the type which may perform an inverter or logic function, is shown formed in another N-well 14 in the layer 10. The device 40 includes a conventional silicided gate structure 42 with sidewall insulator filaments 44 about which self-aligned P-type source/drain diffusions 46 have been formed with associated Lightly Doped Drain extensions (LDDs) 48 extending in the N-well 14 from beneath the filaments 44 to the diffusions 46. The device 40 may be isolated from other devices in a conventional manner, e.g., by junction isolation, formation of field oxide or with shallow trench isolation structures. For simplicity, generally, throughout the figures, the isolation is shown as field oxide, but it is to be understood that the reference numeral 50 indicates placement of any appropriate isolation structures. The device 40 is a P-channel FET and the product 8 may include a complimentary N-channel FET device, e.g., formed directly in the layer 10 or in a P-well (formed within an N-well), to provide CMOS circuitry. Such a conventional N-channel lateral FET is not shown in the figures.

Figure 2:
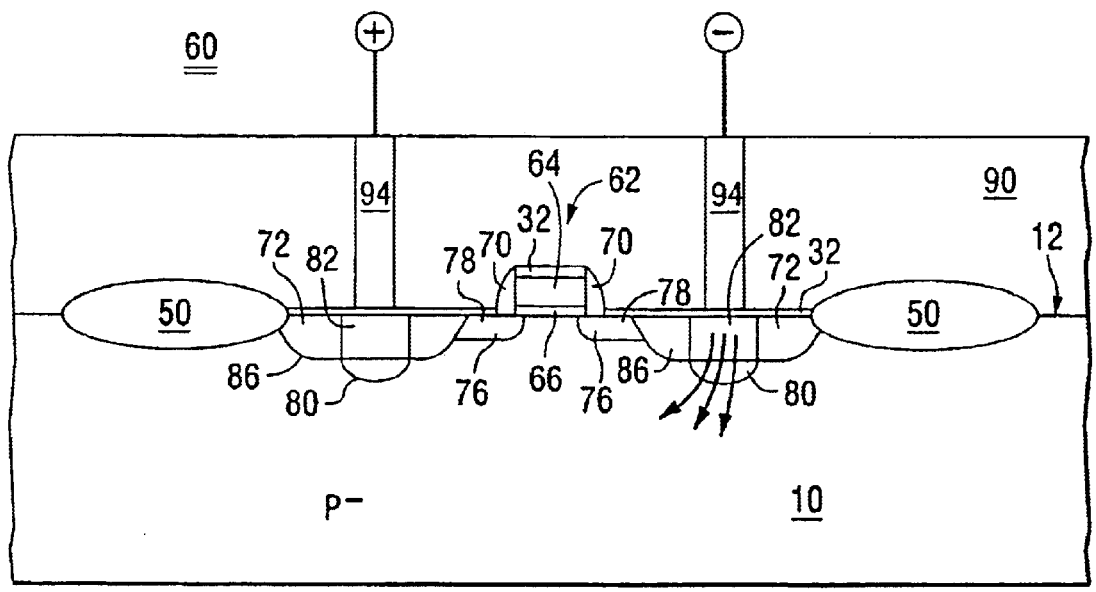
FIG. 2 illustrates in cross section an ESD device according to the invention.

According to a preferred embodiment of the invention, an ESD device 60 is formed in a P-type region of the layer 10. FIG. 2 illustrates additional features of the device 60. A gate structure 62 has a polysilicon conductor 64 formed over a silicon oxide layer 66. Sidewall spacer filaments 70 are formed against the gate structure 62. N-type source/drain diffusion regions 72 are formed with lightly doped drain extensions (LDD's) 76 from the diffusion regions 72 to under the gate structure 62. Semiconductor junctions 86 are formed in part by each of the spaced-apart source/drain diffusion regions 72 and the P-region of the layer 10.

Throughout the figures, the reference numeral 32 indicates regions where silicide layers are formed. A layer 32 of silicide is formed on the polysilicon conductor 64, the diffusion regions 72 and adjoining portions 78 of the LDDs 76 that are not covered by the spacer filaments 70. The device 60 also includes a heavily doped net P-type diffusion region 80 extending into the layer 10 from below each N-type source/drain region 72 and into the underlying P-type portion of the layer 10. Preferably, the device 60 also includes a heavily doped N-type diffusion region 82 nested in the P-type region 80 and positioned to increase the N-type net dopant concentration at the portion of the junction 86 formed with the P-type diffusion region 80. Each N-type region 82 may extend from the upper surface 12 and, preferably, will result in a peak N-type concentration at the junction 86.

In FIG. 1 the device 60 is schematically shown connected to a voltage input terminal Vcc and a ground terminal G-. It is contemplated that other devices 60 (not shown) may be connected between other terminals of the semiconductor product 8.

Figure 3:
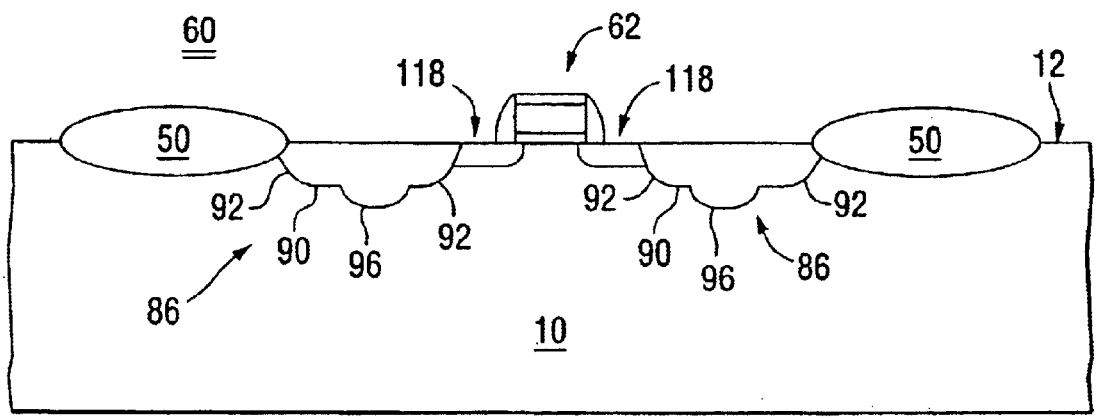
FIG. 3 is a partial schematic illustration of the device of FIG. 2 taken in cross section.

Now also referring to the partial schematic illustration of the device 60 in FIG. 3, the junctions 86 each have a lateral portion 90 and a second portion 92 extending upward toward the surface 12 from the lateral portion 90. Although the junctions 86 have shapes resulting from one or more diffusion fronts associated with regions 72, 76, 80 and 82, the lateral portions 90, as illustrated in FIG. 3, are more or less formed along a plane parallel with the surface 12. Implant energies and selected thermal diffusion cycles for the regions 80 and 82 may affect offsets of the resulting pn junction with respect to other parts of the lateral junction portion 90. The upwardly extending portions 92 include characteristic curved edges of the diffusion fronts which are associated with the planar process. With the regions 80 and 82 each having relatively high net dopant concentrations of different conductivity types, each lateral junction portion 90 includes a relatively large sub region 96 which extends more deeply into the layer 10. When compared to other portions of the junctions 86, the subregions 96 are characterized by a relatively low breakdown voltage.

By way of example, exemplary dimensions are now provided for a typical manufacturing process having 0.35 micron line width capability. With respect to the cross sectional view of FIG. 3, the sub regions 96 extend along the lateral dimension 0.55 micron and the overall area of this heavily doped junction portion is on the order of 0.22 square microns. The lateral junction portions 90 (including the sub regions 96) extend along the lateral dimension about one micron and result in an overall junction area of 0.355 square microns. With reference to the cross sectional view of FIG. 2, the corresponding entire junction 86 (including the LDD) extends about 1.7 microns in the lateral dimension direction, providing an overall junction area of 0.5 square microns. More generally, the lateral dimension of the sub regions 96 preferably ranges between 0.55 micron and 6 microns with an overall junction area ranging between 0.5 and 4.2 square microns.

In the past, relatively small junction regions of low breakdown voltage have been found useful for just triggering the junction into forward or reverse bias conduction. Thus, the implants for creating these regions have been conveniently made through small openings such as an overlying contact window of minimum width, i.e., the openings created during via formation for making metal contact to a source/drain region. Narrow openings, typically on the order of 0.4 micron, define narrow diffusions to trigger the junction into conduction. However, under the stress of high voltage events, such small diffusion regions can lead to metal spiking, especially for a small P-implant region immediately below the contacts. For purposes of comparing these small junction regions with the present invention it is estimated, based on the size of the contact windows through which the small junctions are formed, that the small junction regions would have corresponding lateral dimensions in the range of 0.3 to 0.5 micron and would occupy a heavily doped junction area ranging from 0.06 to 0.15 square microns.

According to the invention, the junction sub regions 96 are larger than required to merely trigger low-voltage conduction along an otherwise high voltage barrier. Preferably, the sub regions 96 are sized to define a large, relatively low impedance path about a region of relatively high thermal conductivity within the layer 10. Accordingly, a majority of current crossing an entire pn junction 86 will travel a path that passes entirely through the junction sub region 96. Such an exemplary current path is schematically shown by solid arrows in FIG. 2.

Figure 4:
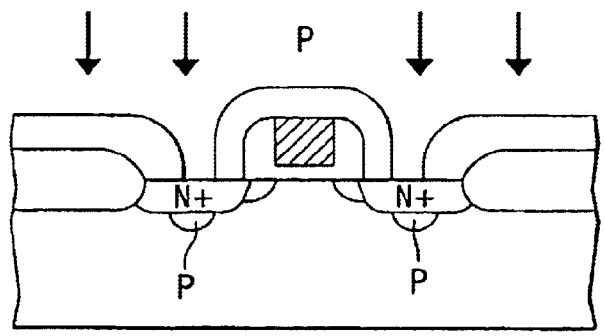
FIG. 4 illustrates a prior art ESD device.

For purposes of comparison a conventional, higher impedance current path about a region of lower thermal conductivity is shown with hatched arrows in the exemplary prior art structure of FIG. 4. That is, the hatched arrows denote current flow near the substrate surface and through the unsilicided LDD portions. Overlying this higher resistance current path and immediately above the semiconductor surface are dielectric regions D which insulate conductive regions from one another but which also contribute to low thermally conductivity properties about the conventional current path.

A feature of the device 60 is provision of a low-voltage trigger region at the bottom of the junction between each source/drain diffusion and the underlying region of opposite conductivity type. So positioning a large trigger region allows the device to sustain substantial current flow in a vertical direction (i.e., into the layer) so that peak heating occurs below the LDD regions and relatively far away from the gate oxide.

Figure 5A:
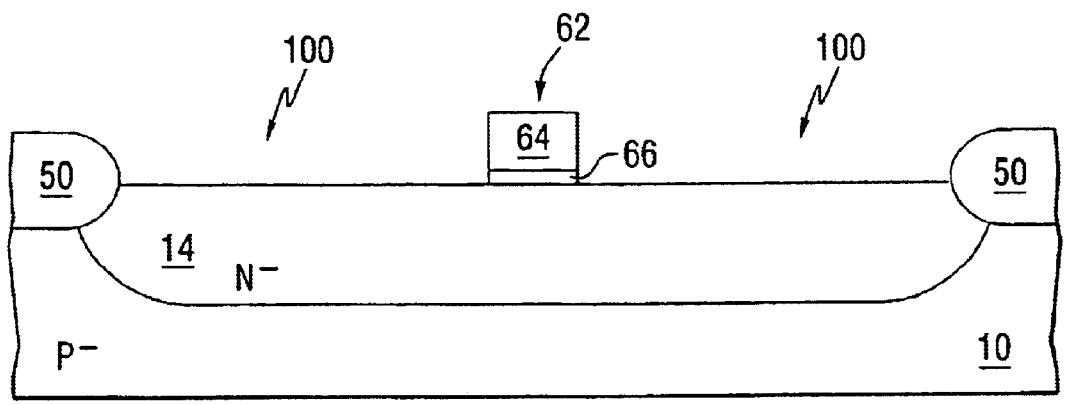
FIGS. 5A through 5C illustrate an exemplary process according to the invention for fabricating an ESD device.
Figure 5B:
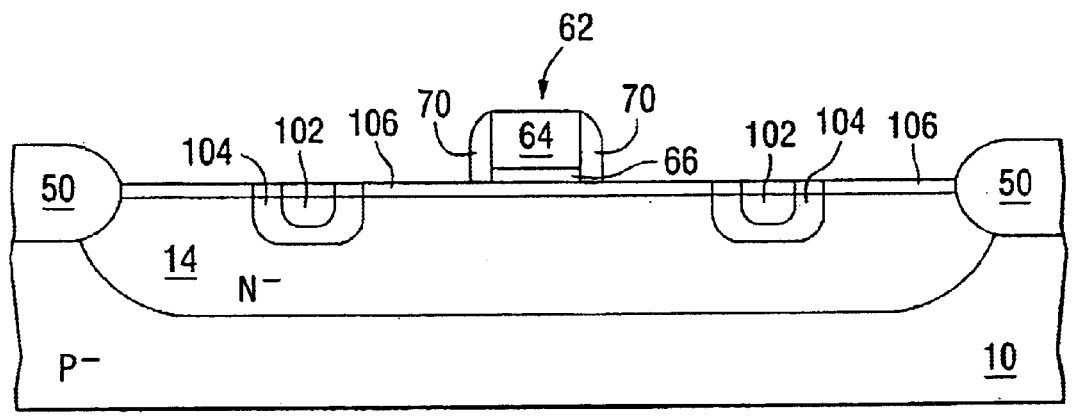
Figure 5C:
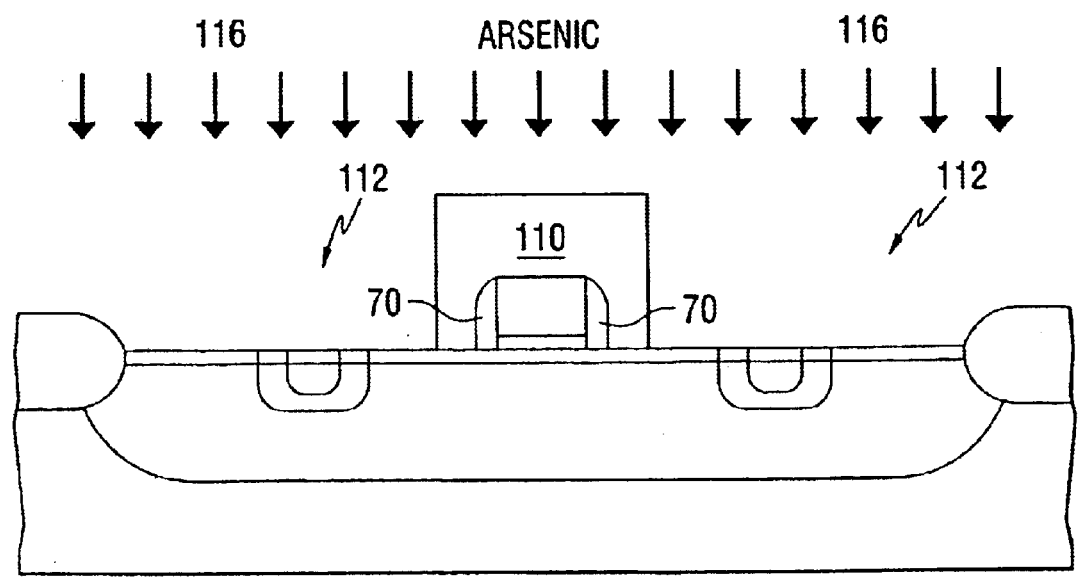

A sequence of exemplary process steps for forming the device 60 is presented in FIGS. 5A–5C. It is to be understood that some of the illustrated steps may be applied to other portions of the substrate layer 10 to effect simultaneous and cost efficient fabrication of other transistors or passive devices.

With field oxide isolation regions 50 formed along the surface 12 of the P-type layer 10, the gate structure 62 is conventionally formed thereon, i.e., with thermal growth of a silicon oxide insulator layer 66, followed by deposition of polysilicon to form the gate conductor 64. The conductor 64 may be implanted to achieve desired low sheet resistance. With patterning of photo resist the layers 64 and 66 are then etched to form the gate structure 62. See FIG. 5A.

Next, according to a preferred embodiment, the resulting regions 100 on opposite sides of the gate structure are patterned with photoresist to form openings between the gate structure 62 and each adjacent isolation region 50. Dopant is implanted through these openings to create the low trigger voltage sub regions 96 of the junctions 86 as shown in FIG. 3. Preferably, a heterodoping implant is made through these openings and, if an LDMOS device such as the device 20 is fabricated simultaneously with the device 60, the heterodoping, retrograde implants such as used for the LDMOS source region(s) 26 and P-body region 28 (see FIG. 1) may also be used to form the P-type region 80 and the N-type region 82 of the device 60 shown in FIG. 2.

For example, the N-type region 82 may first be formed along with the LDD regions 26 by implanting arsenic at a dose of 3e15/cm2 at 30 keV; and then the P-type region 80 may be formed along with the LDD body region 28 by implanting boron at a dose of 5e13/cm2 to 1e14/cm2 at 60 keV. Afterward the photoresist is removed. Such a partially formed ESD device 40 is shown in FIG. 5B, having an N-type implant 102 (for the region 82) and a deeper P-type implant 104 (for the region 80).

Next, with select regions over which other devices being fabricated are masked, the LDD regions 76 are formed with an N-type implant 106 into the regions 100, e.g., with an arsenic dose ranging from 1e13/cm2 to 6e13/cm2 at 30–80 keV. Sidewall spacer filaments 70 are then formed, e.g., by chemical vapor deposition (CVD) of up to 3,000 Angstroms of silicon oxide, silicon nitride or a combination thereof, followed by a conventional anisotropic etch. See again FIG. 5B. The post processing diffusion depth of the resulting LDDs 76 is about 0.2 micron. The same implant may be used to form the LDDs 48 in the device 40 of FIG. 1.

The source/drain regions 72 are defined with patterned photoresist 110 as shown in FIG. 5C to create openings 112 in the regions 100. These openings are spaced apart from the sidewall filaments 70 and extend to adjacent isolation regions 50. The source/drain regions are formed through the openings with an arsenic implant dose 116 ranging, for example, between 1e15/cm2 and 6e15/cm2 at an implant energy of 30–60 keV. After the photoresist is removed, metal such as titanium, cobalt or tungsten is deposited overall and reacted to form the silicide regions 32, preferably over the entire gate conductor 64, the entire exposed surface area of the source/drain regions 72 and portions 118 (see FIG. 3) of the LDD regions 26 that are not covered by the sidewall filaments 70. The ESD device structure of FIG. 2 results after all heat activations are completed. The preferred depth (post diffusion) of the resulting junction 86 is 0.4 micron within a preferred range of 0.2 to 0.5 micron, but the resulting depth of the junction 86 may be 0.7 micron or more below the surface 12. The same implant 116 may be used to form the source/drain regions 46 of the device 40.

Subsequently a silicon oxide insulator layer 90 is deposited over the structure and contact openings are formed for placement of metal contacts 94 to the silicide layers 40 for appropriate connections as schematically shown in FIG. 1.

Advantages and Other Features of the Invention

With portions 118 of the LDD regions having silicide formed there over, the resulting Schottky barrier creates a field in that underlying portion 118 to reduce conductivity. In addition to the application of heterodoping to form the wide, low threshold voltage junction sub region 96, advantages of the FIG. 2 embodiment is include elimination of a mask step to selectively block silicide formation while facilitating flow of current deep into the semiconductor body, e.g., layer 10. That is, in the past, ESD devices have been formed by blocking silicide formation over portions of the drain and LDD regions in order to enhance lateral current flow through the LDD, thereby increasing the ESD current handling ability of the device. Such efforts have required an extra mask step to prevent silicide formation overall, adding to the manufacturing costs. According to the invention, silicide may be formed over the source/drain diffusions, including the LDD's to create a Schottky diode which impedes lateral conduction along the surface 10 while the afore-described vertical path is more conductive.

In the past, to improve performance of lateral conduction in an ESD device there have been supplemental ESD LDD implants, the effect of which has been to increase the LDD junction depth and conductivity with the goal of reducing peak heating levels close to the surface during an ESD event. Such supplemental ESD LDD implants are not necessary to improve ESD performance with the invention. As described herein, a P-type implant, which may also be used for another device on the product 8 (such as the P-body implant that forms the region 28 of the device 20), provides the low trigger voltage at the bottom of the junction 86 to drive the discharge current vertical. Thus, another feature of the invention is provision of an improved ESD protection device without addition of processing steps unique to the ESD device.

Generally, devices constructed according to the principles of the invention provide increased discharge current capability to enable higher performing ESD protection circuitry. With relatively large intrinsic emitter regions, e.g., the N+ region 82 of the device 60, positioned along the bottom of the source/drain diffusions, e.g., at the lateral junction portion 90, the emitter current is directed deeper into the bulk silicon. By way of contrast, a smaller intrinsic emitter region formed along the upward extending junction portion 92 would result in current flow confined to a narrow, more resistive path near the interface between the silicon layer 10 and the gate insulator layer 66. Instead, creation of a Schottky barrier along the surface 10 and above the regions 72 and 78 reduces discharge current localization near the gate insulator layer 66.

Even without the use of silicide to provide a voltage potential barrier along the surface 10, devices according to the invention may be configured to conduct the predominant portion of ESD current through the lateral junction portion. In such embodiments the source/drain regions may be self-aligned with sidewall insulator structures such as the spacer filaments 70 to create a more compact structure.

Figure 6:
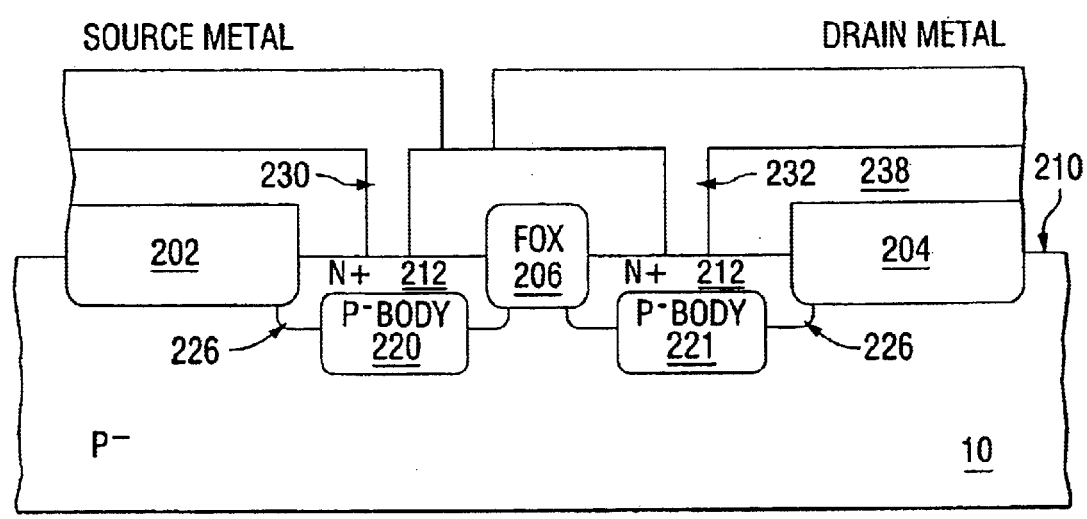
FIG. 6 illustrates in cross section the application of the principles of the invention to a field oxide device.

The above-described principles may also be used to improve ESD capability of a field oxide device. The exemplary field oxide device 200 of FIG. 6 is shown formed in a P-type region of the layer 10 but may also be formed in a P-well. With spaced-apart field oxide formations 202, 204 and 206 formed along the semiconductor surface 210, N+ diffusions 212 are formed, preferably each self-aligned with respect to one of the pairs (202, 206) and (204, 206) of oxide formations. Individual ones of the pairs (202, 206) and (204, 206) of oxide formations are spaced apart from the other in the same pair by about 0.6 micron. The diffusions 212 may have, for example, a lateral width of about 3 microns. Wide P-type implants 220 are formed near the interface of each N+ diffusion 212 and the underlying P-layer 10.

The implants 220 extend primarily into the P-layer 10. The net concentrations resulting from the layer 10 and the diffusions 212 and 220 result in the pn junctions 226. The regions 212 provide a relatively large intrinsic emitter and the regions 220 provide a relatively large intrinsic base to generate bipolar action during an ESD event. Preferably, each region 212 in combination with a region 220 has a lateral width of at least 0.7 micron and forms a junction area of at least 0.28 square micron(s).

The illustrated regions 212 and 220 are not aligned (e.g., not formed with the same mask level) or nested, but such alternate configurations, as illustrated for the device 60, may be preferred. Similarly, the device 60 may be configured with other than the described heterodoping implant, the result of which could be that the diffusions of opposite conductivity type are not symmetrically formed or that neither diffusion is nested with respect to the other.

With the junction 226 having a lateral portion more or less parallel with the surface 210, the relatively large intrinsic emitter and base regions 212 and 220 form the majority of the area of the total lateral junction portion. Accordingly there is a heavily doped junction region, i.e., between each N+ region 212 and a P− region 220, providing wide and vertical (with respect to the plane surface 210) conduction paths during an ESD event.

At the surface 210 each of the diffusion regions is connected to one of two different metal contacts 230 and 232. Preferably, the contacts have the same width as other contacts making connection to functional circuitry. As illustrated, the contacts 230 and 232 may make connections to the source and drain terminals. The contacts are electrically isolated with conventional dielectric material 238. If, during an ESD event, a high current, high voltage discharge propagates through one of the contacts 230 or 232, the device 200 provides a vertical discharge path (with respect to the horizontal surface 210) and transmits the current into the bulk region of the layer 10.

Although the description has illustrated NMOS devices, semiconductor products fabricated according to the invention may include PMOS devices for any of the illustrated devices 20, 40 and 60 as well as CMOS embodiments. When a device is described as formed in a layer (such as P-layer 10) it is to be understood that a similar device could be formed in a well, e.g., a P-type well; and when a device is shown as formed in a well, such as the N-type well 14, it is to be understood that a similar device may be formed in a region of the layer that has N-type dopant concentration, including an epitaxially grown layer.

With respect to the illustrations of FIGS. 1, 2 and 3, for simplicity of presentation only ESD devices based on NMOS FETs, with NPN bipolar parasitic action to form the ESD conduction path, have been shown. Similarly, although field oxide devices based on NPN bipolar parasitic action have been illustrated, devices of opposite conductivity type are contemplated.

For all embodiments of the invention, the above principles may be applied to optimize ESD device performance with respect to area efficiency, reduced mask steps and peak current handling capability at a desired voltage threshold.

Structures and methods have been disclosed which provide improved ESD performance. Generally, by positioning a large intrinsic emitter or collector region deep in the substrate the majority of current flow can be directed in a vertical direction so it is not near the semiconductor surface instead of in a lateral direction near the semiconductor surface.

We claim:

1. A semiconductor product including a device configured along a planar surface of a semiconductor substrate of a first conductivity type to provide electrostatic discharge protection, said device comprising:

first and second spaced-apart diffusions of a second conductivity type each formed along the substrate surface and extending into the substrate to form a pn junction, one of said junctions having a lateral portion extending about a plane parallel to the substrate surface and a second portion extending from the lateral portion toward the substrate surface, a sufficiently large region in the lateral portion having dopants of the first and second polarities for proving a substantially lower breakdown voltage than the second portion such that during conduction across the junction the maximum current density through the lateral portion is greater than the maximum current density through the second portion.

2. The device of claim 1 wherein a majority of the lateral portion has a substantially lower breakdown voltage than the second portion such that during an ESD event most of the conduction across the junction occurs through the lateral portion.

3. The device of claim 1 wherein the average current density through the lateral portion of the pn junction is greater than the average current density through the second portion of the pn junction.

4. The device of claim 1 wherein the lateral portion of each junction includes a diffusion region of the first conductivity type to establish a low breakdown voltage relative to the second portion of the junction.

5. The device of claim 1 wherein the pn junction depth is 0.1 micron to 0.7 micron below the surface.

6. The device of claim 1 wherein the pn junction depth is 0.3 micron to 0.5 micron below the surface.

7. The device of claim 1 wherein the first and second diffusions are formed with an As implant in the range of 1e15 to 6e15 cm−2 at an energy between 30 keV and 160 keV.

8. The device of claim 1 wherein each diffusion is formed between a field oxide region and a gate structure on the substrate surface.

9. The device of claim 1 wherein the substrate includes first, second and third field oxide regions formed along the substrate surface with the first diffusion formed between the first and third field oxide region and the second diffusion formed between the second and third field oxide regions.

10. The device of claim 8 wherein each of the first and second diffusions is self-aligned with at least one of the field oxide regions.

11. The device of claim 1 wherein the lateral portion of the junction extends a distance ranging from 0.8 micron to 6 microns in a direction parallel with the planar substrate surface.

12. An ESD protection device configured along a planar surface of a semiconductor substrate of a first conductivity type to provide electrostatic discharge protection, said device comprising:

first and second spaced-apart diffusions of a second conductivity type formed along the substrate surface and extending into the substrate to form a pn junction, one of said junctions having a lateral portion extending in directions parallel to the substrate surface and a second portion extending from the lateral portion toward the substrate surface, the lateral portion including a sub region having a breakdown voltage which is substantially lower than the minimum breakdown voltage across the second portion of the junction, said region having a minimum lateral width of 0.55 microns and of sufficient area relative to the area of the entire pn junction to carry the majority of current when the pn junction conducts current during an ESD event.

13. The device of claim 12 wherein, on the side of the junction having a net conductivity of the first conductivity type, the net dopant concentration of the sub region is substantially greater than the net dopant concentration along the same side of the junction at the second portion of the junction.

14. The device of claim 12 wherein, when the junction is in a conduction mode, the majority of current flowing across the junction flows through the lateral portion.

15. The device of claim 12 wherein, when the junction is in a conduction mode, the majority of current flowing across the junction flows through the sub region.

16. A semiconductor product having an ESD protection device formed thereon, comprising:

a lightly doped semiconductor substrate of a first conductivity type having an upper surface formed along a plane;

a structure formed along the upper surface;

first and second source/drain regions of a second conductivity type, each formed in the surface and positioned on a different side of the structure, each forming a pn junction with the substrate, each pn junction including a lateral portion extending in directions parallel with the upper surface and a second portion extending from the lateral portion toward the surface;

an implanted region of the first conductivity type positioned to provide a relatively high dopant concentration along a lateral portion, wherein, during an ESD event, said protection device is characterized by a net low resistance and high current flow through the lateral portion of the junction relative to the second portion of the junction.

17. The product of claim 16 wherein the structure formed along the upper surface is a FET gate structure.

18. The product of claim 16 wherein the structure formed along the upper surface is an electrically insulative isolation region.

19. The product of claim 16 wherein the structure formed along the upper surface is a field oxide isolation region.

20. The product of claim 16 configured as an integrated circuit and further including a first lightly doped region of the second conductivity type extending from the first source/drain region toward the structure;

a first silicide region contacting the first lightly doped region to form a Schottky barrier;

a second lightly doped region of the second conductivity type extending from the second source/drain region toward the gate; and a second silicide region contacting the second lightly doped region to form a Schottky barrier, so that during an ESD event, said protection device is characterized by a high current flow into the lateral portion of the junction and a low current flow through the second portion of the junction.

* * * * *